United States Patent [19]

Kobayashi et al.

[11] Patent Number: 5,102,813

[45] Date of Patent: Apr. 7, 1992

[54] METHOD OF FABRICATING A THIN FILM TRANSISTOR

[75] Inventors: Kazuhiro Kobayashi, Amagasaki, Japan; Kris A. E. F. Baert, Leuven; Johan F. A. Nijs, Lubbeek, both of Belgium

[73] Assignee: Interuniversitair Micro Elektronica, Netherlands

[21] Appl. No.: 358,952

[22] Filed: May 30, 1989

[30] Foreign Application Priority Data

May 30, 1988 [NL] Netherlands .......................... 8801379

[51] Int. Cl.$^5$ .................................... H01L 21/205
[52] U.S. Cl. ........................................ 437/40; 437/41; 437/101; 437/233; 148/DIG. 1; 148/DIG. 122
[58] Field of Search .................... 437/40, 41, 101, 225, 437/233, 234, 2; 357/23.7, 2, 4; 148/DIG. 1, DIG. 122

[56] References Cited

U.S. PATENT DOCUMENTS

| 4,226,898 | 10/1980 | Ovshinsky et al. | 437/2 |
| 4,523,214 | 6/1985 | Hirose et al. | 437/234 |
| 4,597,160 | 7/1986 | Ipri | 437/41 |
| 4,727,044 | 2/1988 | Yamazaki | 437/101 |
| 4,737,379 | 4/1988 | Hudgens et al. | 437/234 |
| 4,746,628 | 5/1988 | Takafuji | 437/101 |
| 4,762,808 | 8/1988 | Sharp et al. | 437/101 |
| 4,769,338 | 9/1988 | Ovshinsky et al. | 437/101 |
| 4,800,174 | 1/1989 | Ishihara et al. | 437/101 |
| 4,842,897 | 6/1989 | Takeuchi et al. | 437/225 |
| 4,880,753 | 11/1989 | Meakin et al. | 437/200 |

Primary Examiner—Olik Chaudhuri
Assistant Examiner—M. Wilczewski

[57] ABSTRACT

A thin film transistor is produced by applying onto a non-silicon foundation, a thin film of silicon semiconductor material under such conditions that polycrystalline or microcrystalline material is formed. Source and/or drain regions of doped semiconductor material are then formed onto the film; following by applying insulating material onto the film, and a gate region onto the insulating material. The source and/or drain regions are applied so that such regions have a crystalline structure that depends upon the crystalline structure of the underlying thin film. The resulting source and drain regions have high lateral conductivity so that source and drain contacts can be made with reduced cross-sectional areas. The method may employ a self-alignment process to simplify device production.

9 Claims, 4 Drawing Sheets

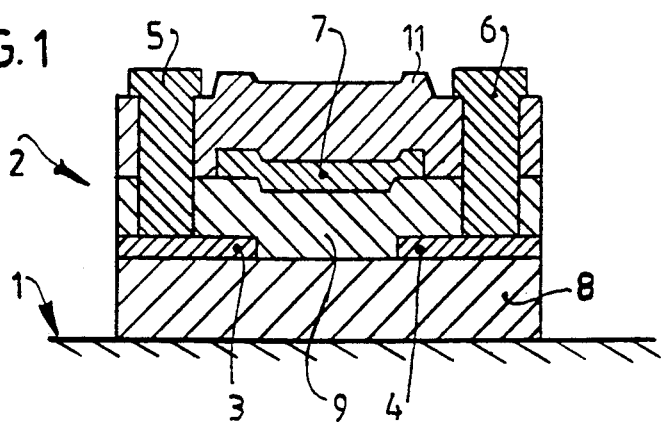
FIG. 1
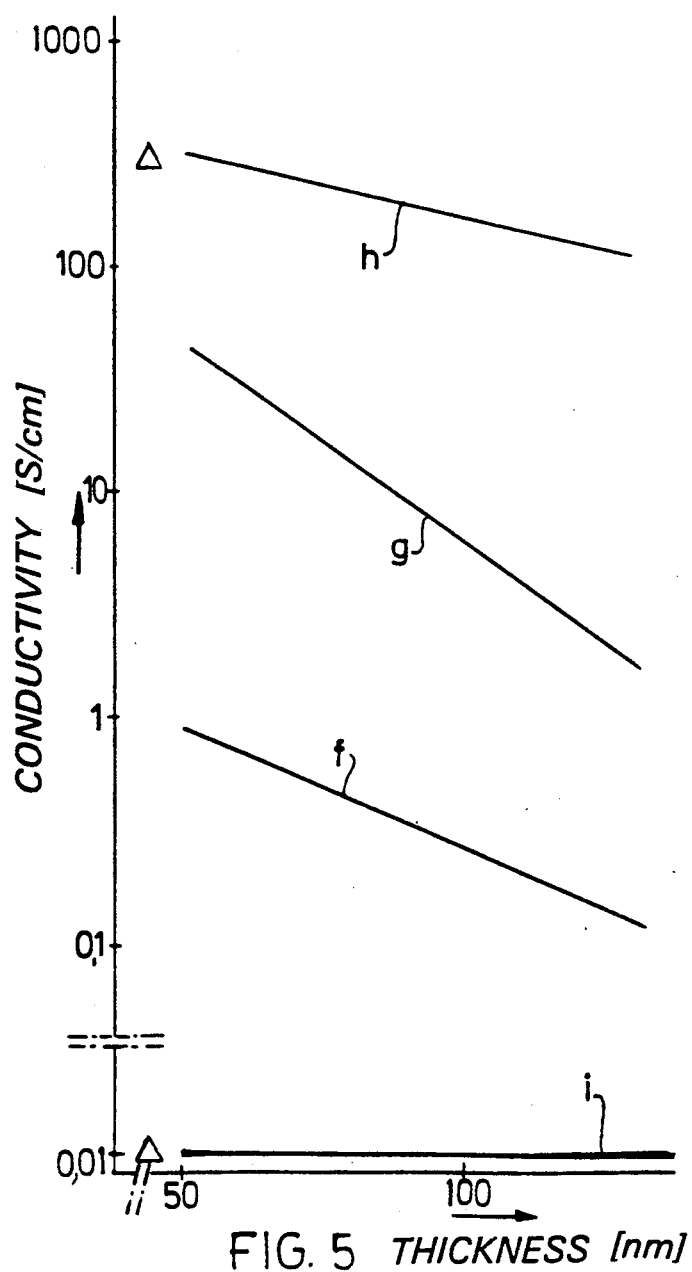
FIG. 5 THICKNESS [nm]

METHOD OF FABRICATING A THIN FILM TRANSISTOR

BACKGROUND OF THE INVENTION

The present invention relates to the production of thin film transistors in which the conductivity of source and/or drain regions should be high, e.g. for driving liquid crystal displays (LCD).

From the prior art it is known to produce source and/or drain regions for a thin film transistor with a high conductivity, e.g. greater than or equivalent to $1\Omega^{-1}$ cm$^{-1}$ by means of ion implantation. Such ion implantation is cumbersome, requires complicated equipment and is difficult to apply to relatively large surfaces Further,. it is known from EP-A-0062079 to produce a semiconductor layer in microcrystalline form by means of a PECVD reactor.

U.S. Pat. No. 4625224 relates to a thin film transistor having 0.001-5 atomic %CL.

EP-A-0161555 relates to a polycrystalline silicon thin film transistor structure having source and drain regions in amorphous form.

Also US-A-4,485,121, EP-A-0232619 and GB-A-2156385 show structures using amorphous materials.

Further the following publications are known to the applicant: EP-0132076, EP-0200552, EP-0201270, EP-0206649, EP-0206650, EP-0228295, EP-0228870, EP-0229518, EP-0229707, EP-0232148, EP-0234094, EP-0240305, EP-0240306, EP-0240314, EP-0241311, EP-0241316, EP-0241317, EP-0242207, EP-0243074; and the article "Very-low-Temperature Silicon Epitaxy by Plasma-DVD Using SiH$_4$-PH$_3$-H$_2$ Reactants for Bipolar Devices" from the Japanese Journal of Applied Physics, Vol. 27 No. 4, April 1988, pages L493-L495.

SUMMARY OF THE INVENTION

It is an object of the present invention to improve upon the above prior art.

It is a further object of the present invention to produce a thin film transistor using relatively inexpensive equipment.

It is a further object to produce a thin film transistor having high conductivity in source and drain regions at relatively low temperatures.

Yet another object of the present invention is to produce a thin film transistor having such a high lateral conductivity in source and drain regions, that cross sectional areas of its source and drain contacts can be smaller than the cross sectional areas of the source and/or drain regions. This feature simplifies alignment in the production process and is of great importance for reducing the dimensions of such a thin film transistor.

Another aspect relates to a depositing process in which a type of self-alignment is advantageously used.

The present invention relates to a method of producing a thin film transistor comprising the steps of:

applying a thin film of semiconductor material, comprising silicon, under such conditions that polycrystalline or microcrystalline material is formed, onto a non silicon foundation, e.g. a sheet of glass or quartz;

applying source and/or drain regions of doped semiconductor material onto said film;

applying insulating material onto said film; and applying a gate region onto said insulating material;

in which the source and/or drain regions are applied such that the source and/or drain regions have a crystalline structure that is related to the crystalline structure of said thin film.

Preferably flour (F) is used in the process, since F-ions show properties for etching an oxidized top layer. Further, the presence of F-ions may diminish the H content in a deposited layer which H content could prevent grains from growing.

Further, the present invention relates to a thin film transistor.

BRIEF DESCRIPTION OF THE DRAWINGS

Further objects, features, details and advantages of the present invention will be clarified on the basis of the following disclosure in which preferred embodiments are illustrated with reference to the accompanying drawing, in which:

FIG. 1 is a section view of a thin film transistor according to the present invention, produced according to a method according to the present invention;

FIG. 5 is a graph of the conductivity of the source and drain regions of the thin film transistor from FIG. 1, produced according to another preferred embodiment of the method according to the present invention;

DETAILED DESCRIPTION OF THE PREFERRED EMBODIMENTS

Figure 2:
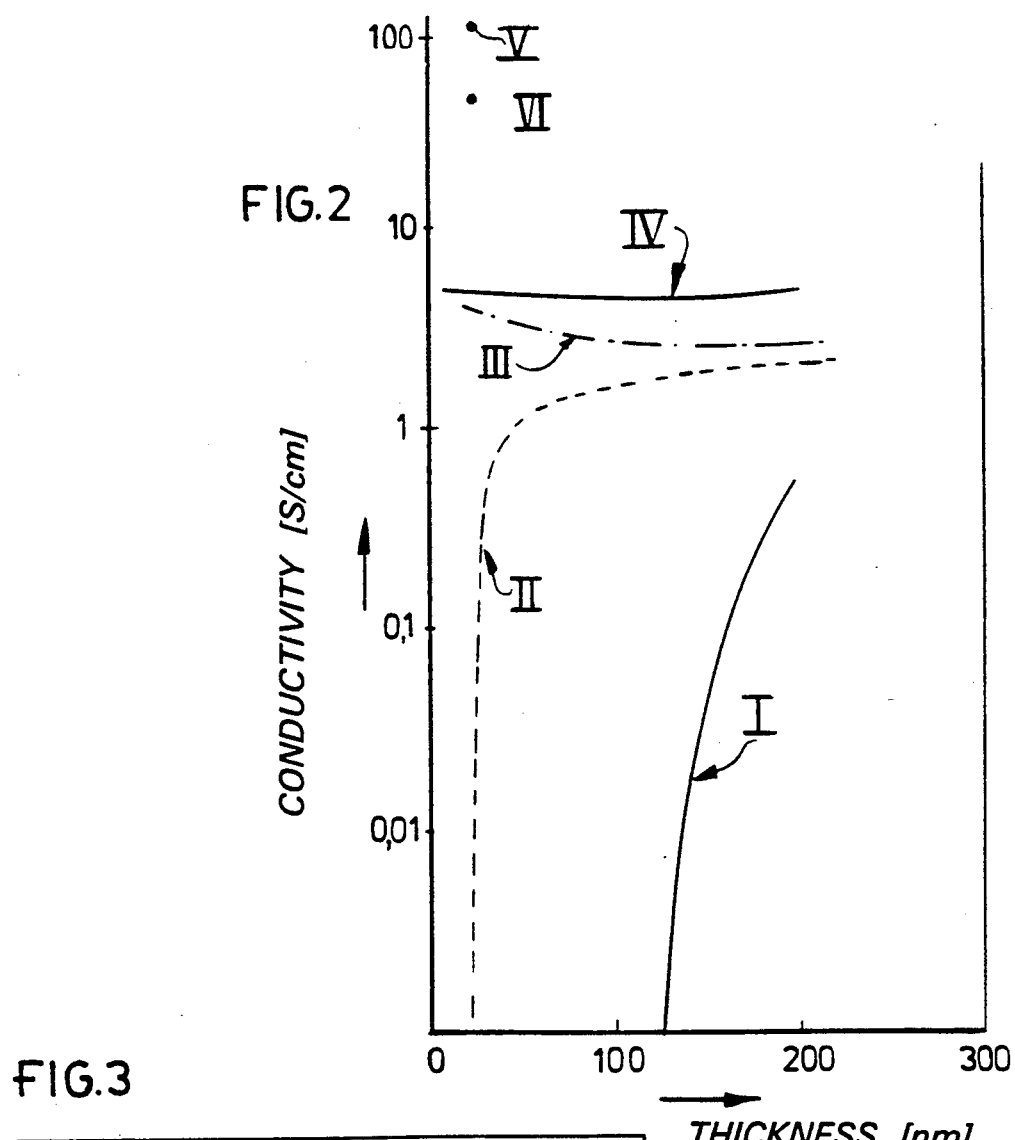
FIG. 2 is a graph of the conductivity of the source and drain regions of a thin film transistor of FIG. 1, related to the thickness of the layers applied according to the invention.

A thin film transistor 2 disposed onto a sheet or plate 1 (FIG. 1) of glass or quartz is produced as follows:

A polycrystalline silicon bulk layer or a thin film is disposed in a LPCVD reactor (Low Pressure Chemical Vapour Deposition) in a direct or indirect way, indirectly meaning to first deposit an amorphous silicon layer at 550° C., after which annealing is executed at 630° C., whereby a grain size up to 400 nm is obtained; it is also possible to deposit such a polycrystalline layer in a plasma enhanced CVD reactor.

Thereafter the polysilicon thin film 8 is dipped in hydrogen fluoride (HF-dip), rinsed in a glove box using a N$_2$ purge so as to diminish water and oxygen pollution of the system. It is apparent that other methods may be used to prevent water and oxygen pollution.

Next a layer is disposed under amorphous-like or microcrystalline-like deposition conditions in a PECVD reactor (Plasma Enhanced Chemical Vapour Deposition); and then such layer is selectively etched (Auto-Stop-Etching), such that source and drain regions 3, 4 respectively are defined.

A gate insulator 9 of SiO$_2$ is then disposed in a APCVD reactor (Atmospheric Pressure Chemical Vapour Deposition); for the skilled artison it is also apparent that, instead any other gate insulator may be used, such as silicon nitride. Onto such insulator a metal layer, e.g. of chromium (Cr), is disposed from which after an etching step the gate 7 is produced. The gate may instead be of semiconductor material.

Next, a covering oxide layer 11 is disposed over the gate contact and the gate insulating layer 9; and finally contacts 5, 6 for connecting source, drain and/or gate regions 3, 4, 7 respectively of metal, e.g. aluminium, are disposed after providing holes therefor.

Producing source and drain regions was executed in a PD80 deposition system of Plasma Technology under circumstances according to the following table.

|  |  | Amorphous-like | Microcrystalline like |
|---|---|---|---|
| Gasflow 1% $PH_3$ in $SiH_4$ | sccm | 5–40 | 3–6 |
| Gasflow $H_2$ | sccm | 0 | 150 |
| Rf-power | W | 5–10 | 30–50 |
| Pressure | mTorr | 50–100 | 70 |
| Temperature | °C. | 250–450 | 250–450 |

Tests show that depositing silicon under microcrystalline or amorphous conditions produces a conductivity of such a layer that is depends on the conductivity of the underlying layer. The curves of FIG. 2 illustrate this principle. Curves I and II show the increase of conductivity at increasing thickness of a layer disposed on a glass plate, at different grow rates, viz. 3.3 nm per minute and 1.3 nm per minute, respectively; curves III and IV show test results under microcrystalline-like depositing conditions in the plasma reactor, having a bulk layer of polysilicon as foundation, whereby again deposition rates of 3.3, 1.3 nm/minute respectively were used. Dots V and VI show two separate measurements of a thin layer slowly deposited, viz. at a rate of 0.12 nm/minute and 0.2 nm/minute respectively. The conductivity or resistance measurements used a fourpoint probe Without limiting the invention, a plausible explanation of the differences between the curves of FIG. 2 is that epitaxial-like growth is produced and that polycrystalline information of the substrate is transmitted to the layer to be deposited thereon, whereby an accordingly-lower resistance of at least a first part of that layer is produced. The crystalline structure of the upper layer is related to the crystalline structure of the lower layer.

Figure 3:
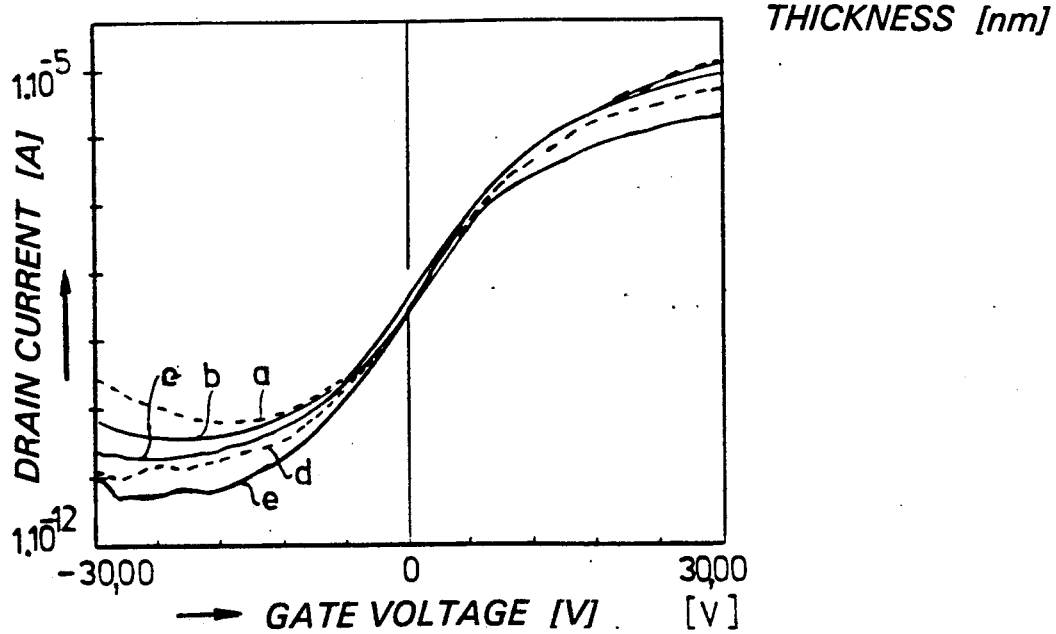
FIG. 3 is a graph of the drain current, related to the gate voltage of the thin film transistor from FIG. 1.
Figure 4:
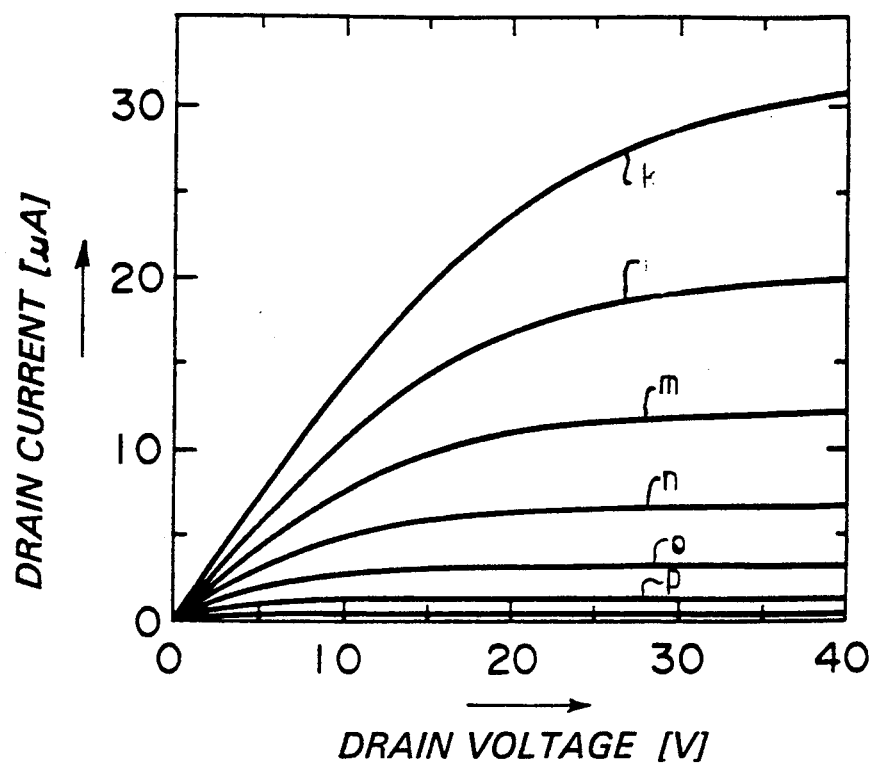
FIG. 4 is a graph of the drain current of the thin film transistor from FIG. 1, related to the drain voltage.

Typical characteristics (FIGS. 3, 4 respectively) of drain and gate current of a thin film transistor according to the present invention are satisfactory; curves a, b, c, d and e (FIG. 3) were measured at a drain voltage of 30, 20, 10, 6, 2 volt respectively; curves k, l, m, n, o and p (FIG. 4) at a gate voltage of 40, 35., 30, 25, 20 and 15 volt respectively.

A second embodiment of the method according to the invention for producing drain and/or source regions to be used in a structure shown in FIG. 1, uses amorphous deposition conditions, followed by annealing of the produced layer.

As a standardized preferred embodiment of the method according to the invention there is used a power of 5 W, a pressure of 50 m Torr, a $SiH_4$ flow of 20 sccm, a temperature of 300° C. and 1% $PH_3$ in the $SiH_4$ flow. For 10 seconds the substrate was dipped in a 10% HF solution, before applying the layer.

An annealing temperature of 630° C. for three hours makes it possible to produce a thin film transistor on Hoya BSi-glass, which remains solid at such temperature. FIG. 5 shows the achieved conductivity C of the source and drain regions as a function of thickness D.

Line i joins measuring dots of the conductivity layer directly disposed on a glass plate, line f joins measuring points of such a layer after being annealed, line g shows the conductivity of a layer of silicon deposited on a polycrystalline substrate after a HF dip and line h shows the conductivity after sequential annealing.

The two triangles in FIG. 5 relate to two measurements on a a-Si:H layer annealed at 600° C., deposited on a sheet of glass and polycrystalline layer respectively. At this temperature the difference in conductivity is even more significant, since at 600° C. less nuclei for crystallization are formed than at 630° C. The value of the conductivity was found to be independent of the duration of the annealing process, which duration was varied between 1–12 hours. The thickness of the layer was 20 nm.

The reduction in conductivity of the layer at increasing thickness indicates a decreasing degree of crystalline structure of the layer at increasing distance from the polycrystalline substrate. A certain minimal duration of the chemical influence of F ions appears to be desired.

Without limiting the invention, an explanation for further improvement of the conductivity according to the second embodiment is based on the assumption that the source and/or drain areas forms larger polycrystalline grains spaced from the substrate, under amorphous-like deposition conditions and after annealing, than at microcrystalline-like deposition conditions.

The above results were achieved by means of a relatively simple plasma CVD reactor, which was sealed by means of O-rings; no ultra high vacuum is required; and the reactor used was relatively inexpensive.

Figure 6:
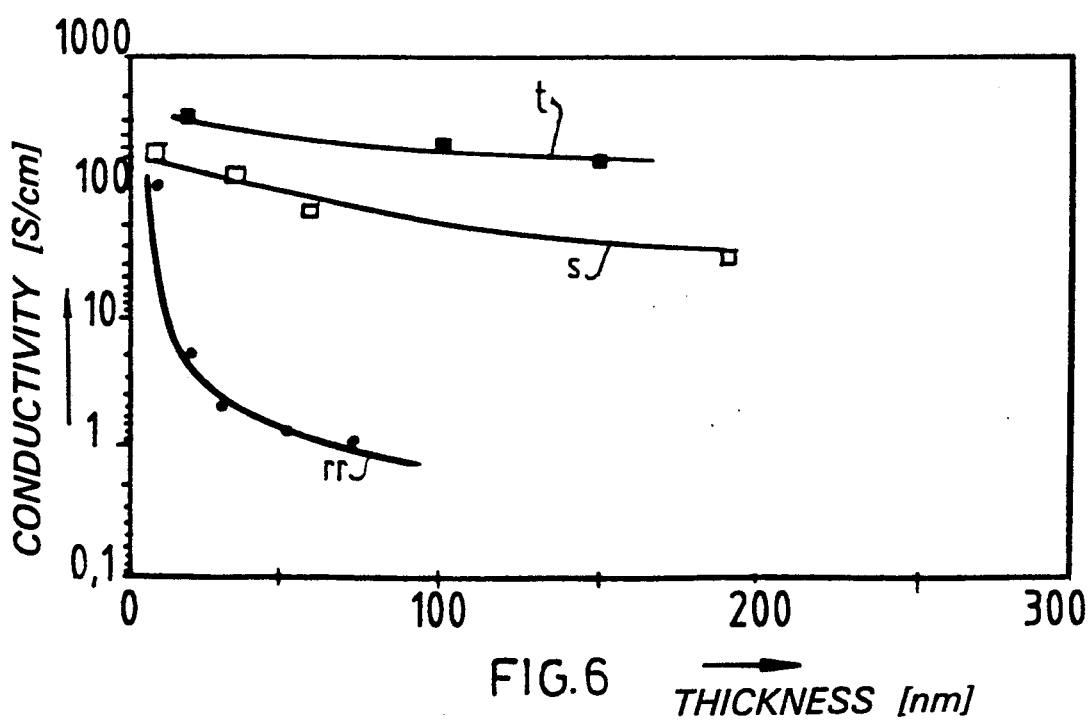
FIG. 6 a graph showing the conductivity of the source and drain regions of the thin film transistor from FIG. 1, produced according to a yet other preferred embodiment of the method according to the present invention.

The results of a third embodiment of the method according to the present invention (FIG. 6) were obtained by introducing a fluoridized $SiH_4$ gas, or $SiH_nF_{4-n}$ (n = 1,2,3) into the PECVD apparatus. Curve rr relates to the position under microcrystalline conditions, as above mentioned; curve t relates to the preferred embodiment, as above described in which A-Si:H is annealed; and curve s relates to the third embodiment, in which $SiH_2F_2$ is introduced at a rate of 5 sccm, 1% $PH_3$ in $SiH_4$ is introduced at a rate of 1 sccm, $H_2$ is introduced at a rate of 100 sccm, at a pressure of 3 Torr a temperature between 250°–350° C. and an applied power of 17–35 watts.

A fourth embodiment of the method according to the present invention (FIGS. 7A–7C) improves alignment of source and drain areas relatively to the gate, without using an additional mask step.

Figure 7A:
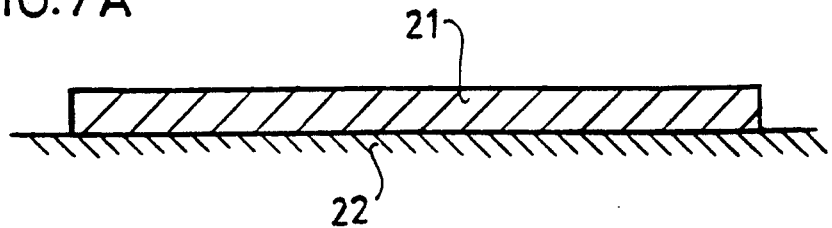
FIG. 7A-7C show steps of producing the thin film transistor of FIG. 1 in accordance with a method of the invention.
Figure 7B:
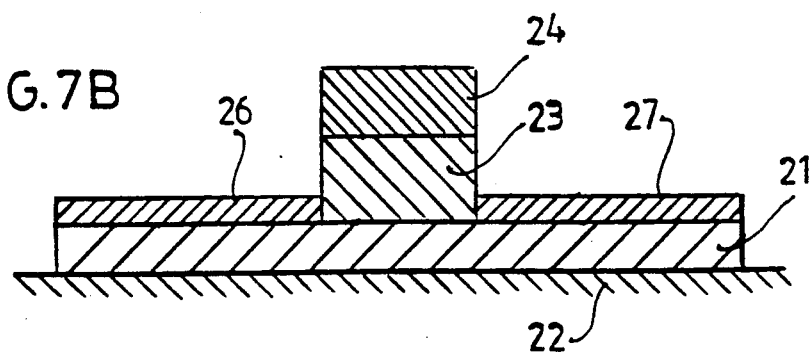
Figure 7C:
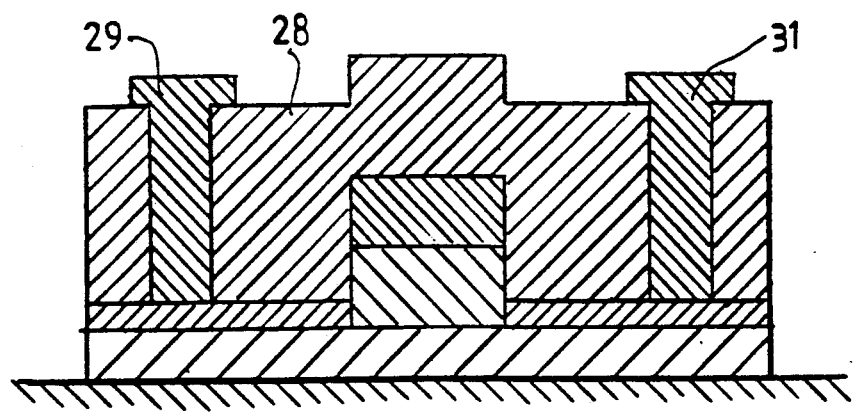

By means of a first mask (not shown) a layer 21 of polycrystalline silicon was deposited on a quartz sheet 22 (FIG. 7A). By means of a second mask (not shown) a gate insulator 23 (FIG. 7B) and a gate 24 of conducting or semiconducting material are provided.

Thereafter source and drain regions 26, 27 respectively (FIG. 7B) were applied in a PECVD reactor under such conditions that no deposition was measurable onto the quartz plate 22 nor on the sides of the gate insulator 23. This was achieved by introducing $SiF_4$ into the PECVD reactor in a temperature range between 300°–350° C. At such temperatures Si-radicals were etched from a $SiO_2$ surface while deposited on a polysilicon foundation.

Next, by means of two consecutive masks a passivation layer 28 of $SiO_2$ and source and drain contacts 29, 31 respectively were applied, obtaining a thin film transistor having mutually aligned gate and source/drain-regions.

Due to the absence of overlap between the gate 24 and source and drain regions 26, 27 respectively, the AC conduction of the thin film transistor is improved; at decreasing dimensions of the process, moreover, the self-alignment provides distinct advantages over the prior art.

Although the present invention has been described in connection with a preferred embodiment thereof, many variations and modifications will now become apparent to those skilled in the art. For example, other epitaxial techniques for depositing onto a polycrystalline bulk layer can be used; the plasma technique using radio frequencies and containing flour being preferred due to the possibility of growing at low temperatures and because high concentrations of dopant can be achieved. Other dopants than phosphors can be included in the process, source and/or drain regions may further include H, F, Ge, Cl etc. It is preferred, therefore, that the present invention be limited not by the specific disclosure herein, but only by the appended claims.

What is claimed is:

1. A method of producing a thin film transistor, comprising:
    applying onto a non-silicon foundation a thin film of silicon semiconductor material under such condition that polycrystalline or microcrystalline material is formed;
    forming source and/or drain regions of a doped semiconductor material on said film;
    applying insulating material onto said film; and forming a gate region on said insulating material;
    wherein forming said source and/or drain regions includes depositing such semiconductor material by a PECVD process in which an etching gas is present to etch oxide from the film such that said source and/or drain regions at least in the region of said thin film have a crystalline structure that depends upon the crystalline structure of said thin film and said source and drain regions have a conductivity greater than or equivalent to approximately 5 mhos per cm.

2. A method according to claim 1, further comprising the step of subjecting said film to a HF dip prior to introducing said film into a PECVD apparatus.

3. A method according to claim 2, in which said semiconductor material is deposited under conditions for depositing amorphous silicon, after which the so-formed structure is annealed for a predetermined time period.

4. A method according to claim 3, in which annealing is performed at a temperature under 700° C.

5. A method according to claim 2, in which said semiconductor material is deposited under conditions for depositing microcrystalline material.

6. A method according to claim 5, in which the so-formed structure is annealed for a predetermined time period.

7. A method according to claim 1, in which said semiconductor material is deposited under microcrystalline conditions and said etching gas is $SiH_nF_{4-n}$ (n=0,1,2,3).

8. A method according to claim 1, in which the etching gas is $SiF_4$.

9. A method according to claim 1, in which the so-formed structure is annealed for a predetermined time period.

* * * * *